(12) United States Patent
Furuta et al.

(10) Patent No.: US 12,270,862 B2
(45) Date of Patent: Apr. 8, 2025

(54) BATTERY MONITOR SYSTEM

(71) Applicant: DENSO CORPORATION, Kariya (JP)

(72) Inventors: Yoshikazu Furuta, Kariya (JP); Soya Taniguchi, Kariya (JP); Tomohiro Nezuka, Kariya (JP); Kazutaka Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 195 days.

(21) Appl. No.: 18/153,450

(22) Filed: Jan. 12, 2023

(65) Prior Publication Data

US 2023/0147469 A1 May 11, 2023

Related U.S. Application Data

(63) Continuation of application No. PCT/JP2021/029907, filed on Aug. 16, 2021.

(30) Foreign Application Priority Data

Sep. 4, 2020 (JP) ................................ 2020-149046

(51) Int. Cl.
*G01R 31/396* (2019.01)
*G01R 31/367* (2019.01)
*G01R 31/3842* (2019.01)
*G01R 31/389* (2019.01)

(52) U.S. Cl.
CPC ......... *G01R 31/396* (2019.01); *G01R 31/367* (2019.01); *G01R 31/3842* (2019.01); *G01R 31/389* (2019.01)

(58) Field of Classification Search
CPC ................ G01R 31/396; G01R 31/367; G01R 31/3842; B60L 3/12
See application file for complete search history.

(56) References Cited

U.S. PATENT DOCUMENTS

| 11,892,514 B2* | 2/2024 | Taniguchi ............ G01R 31/396 |
| 2021/0028637 A1 | 1/2021 | Kitagawa et al. |
| 2021/0109160 A1 | 4/2021 | Matsukawa et al. |
| 2021/0223327 A1* | 7/2021 | Berger ................. G01R 31/396 |
| 2022/0074999 A1 | 3/2022 | Taniguchi et al. |

FOREIGN PATENT DOCUMENTS

| JP | 2006-266960 A | 10/2006 |
| JP | 2017-058176 A | 3/2017 |
| JP | 2019-190939 A | 10/2019 |
| WO | 2017/009891 A1 | 1/2017 |

* cited by examiner

*Primary Examiner* — Christopher E Mahoney
(74) *Attorney, Agent, or Firm* — Posz Law Group, PLC

(57) ABSTRACT

A battery monitor system includes: a reference signal generation unit; an excitation signal generation unit; a current generation unit for an excitation current; a current measurement unit for the excitation current; a voltage measurement unit for a voltage of each battery cell; an impedance measurement unit for an impedance of each battery cell; a noise measurement unit for a noise voltage; and a control unit. The control unit selects one or more battery cells not a measurement target, and the noise measurement unit measures the noise voltage near a measurement frequency equal to a frequency of an orthogonal reference signal while operating the voltage measurement unit without operating the current generation unit.

14 Claims, 17 Drawing Sheets

FIG. 19

| Index | FREQ[Hz] | REAL NUMBER IN IMPE (Ω) | IMAGINARY NUMBER IN IMPE (Ω) | NOISE (V) |
|---|---|---|---|---|
| 1 | 10 | 0.001100 | −0.000400 | 0.0000005 |
| 2 | 12 | 0.001009 | −0.000450 | 0.0000100 |
| 3 | 15 | 0.001008 | −0.000500 | 0.0010000 |
| 4 | 17 | 0.001007 | −0.000550 | 0.0000100 |
| 5 | 20 | 0.001006 | −0.000600 | 0.0000015 |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |

BATTERY MONITOR SYSTEM

CROSS REFERENCE TO RELATED APPLICATIONS

The present application is a continuation application of International Patent Application No. PCT/JP2021/029907 filed on Aug. 16, 2021, which designated the U.S. and claims the benefit of priority from Japanese Patent Application No. 2020-149046 filed on Sep. 4, 2020. The entire disclosures of all of the above applications are incorporated herein by reference.

TECHNICAL FIELD

The present disclosure relates to a system that monitors a plurality of battery cells forming a battery assembly.

BACKGROUND

In recent years, electric vehicles using secondary batteries and the like are spreading, and a demand for a battery monitor system (i.e., Battery Management System or BMS) for safely using secondary batteries is increasing. As for the secondary battery, by measuring an AC impedance and the like thereof, it is possible to estimate the internal state including the remaining battery capacity (i.e., State of Charge or SOC). For example, according to a conceivable technique, a signal excitation unit that causes a current to flow through a measurement target, a current measurement unit, and a voltage measurement unit that measures the response voltage from the battery are arranged with respect to each battery cell, and the impedance is measured using the current value and the voltage value obtained from these units. In the measurement using this AC impedance method, only the signal of the frequency component equal to the measurement frequency is detected, so the noise removal capability is high and measurement with a good signal-to-noise ratio (i.e., SNR) is possible.

SUMMARY

According to an example a battery monitor system may include: a reference signal generation unit; an excitation signal generation unit; a current generation unit for an excitation current; a current measurement unit for the excitation current; a voltage measurement unit for a voltage of each battery cell; an impedance measurement unit for an impedance of each battery cell; a noise measurement unit for a noise voltage; and a control unit. The control unit selects one or more battery cells not a measurement target, and the noise measurement unit measures the noise voltage near a measurement frequency equal to a frequency of an orthogonal reference signal while operating the voltage measurement unit without operating the current generation unit.

BRIEF DESCRIPTION OF THE DRAWINGS

The above and other objects, features and advantages of the present disclosure will become more apparent from the following detailed description made with reference to the accompanying drawings. In the drawings:

FIG. 19 is a diagram showing an example of a data table indicating impedance values and noise values at each frequency;

DETAILED DESCRIPTION

Figure 1:
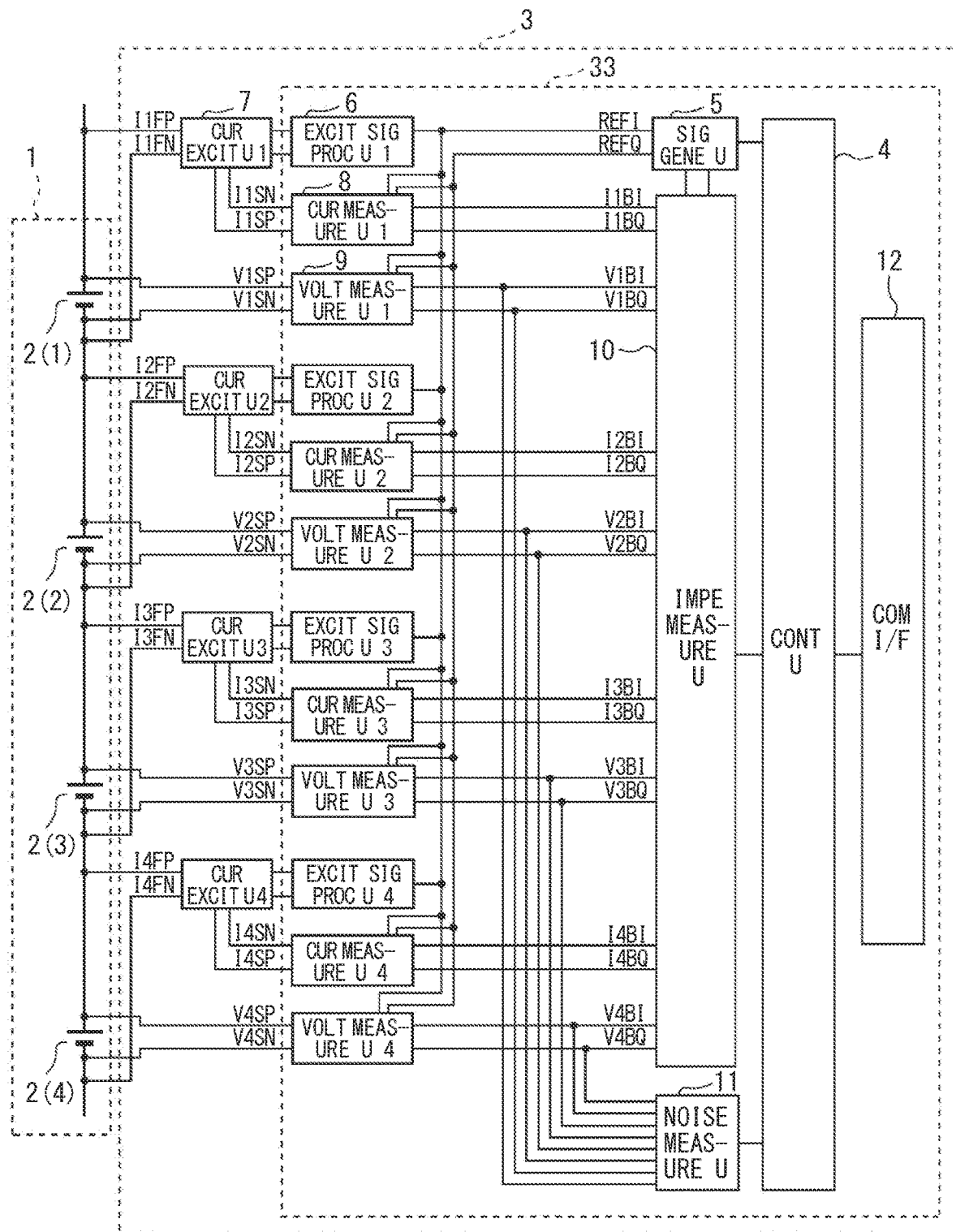
FIG. 1 is a functional block diagram showing the configuration of a battery monitor device in a first embodiment.

For example, a battery pack mounted on an electric vehicle or a hybrid vehicle is connected to an inverter for driving a motor, and when the vehicle is running, the drive current of the inverter is superimposed on the battery current as noise current. In the impedance measurement of the conceivable technique, an error may occur in the impedance measurement result when a noise current including frequency components that are the same as or near the measurement frequency is superimposed on the excitation current. Therefore, accurate impedance measurement may not be performed while the vehicle is running, and an error may occur in the estimation of the internal state.

The present embodiments have been made in view of the circumstances described above, and an object thereof is to provide a battery monitor system capable of accurately measuring the impedance of a secondary battery even in an environment where noise current flows.

According to the battery monitor system, the excitation signal generation unit generates the excitation signal by processing the in-phase signal of the orthogonal reference signal generated by the reference signal generation unit, and the current generation unit generates the excitation current based on the excitation signal to energize the battery cell. The impedance measurement unit measures the alternating-current impedance of the battery cell based on the excitation current measured by the current measurement unit and the voltage of the battery cell measured by the voltage measurement unit. The noise measurement unit measures noise superimposed on the battery cell as a noise voltage based on the voltage measured by the voltage measurement unit, and estimates the noise current.

The control unit selects one or more battery cells whose AC impedance is not to be measured as a measurement target from among the plurality of battery cells, and measures the noise voltage near the measurement frequency equal to the frequency of the orthogonal reference signal using the noise measurement unit under a condition that only the voltage measurement unit connected to the selected battery cell is operated without operating the current generation unit connected to the selected battery cell. By controlling in this way, it is possible to measure the impedance of the battery cell and measure the noise voltage in parallel without affecting each other. Therefore, even when the battery assembly is supplying power to the load, it is possible to measure the impedance and the noise voltage with high accuracy.

According to the battery monitor system, the cell voltage measurement unit measures the voltage of the battery cell, and the resistance voltage measurement unit measures the voltage of the resistance element connected in series to the plurality of battery cells. Then, the control unit measures the noise voltage in the same manner as in claim 1 while operating the resistance voltage measurement unit without operating the current generation unit. Even in this configuration, it is possible to measure the impedance of the battery cell and the noise voltage in parallel without affecting each other, as in claim 1.

According to the battery monitor system, the control unit transmits the noise voltage measured by the noise measurement unit to the higher level system together with the measurement result of the AC impedance by the impedance measurement unit. This allows the higher level system to evaluate the AC impedance measurement result based on the noise voltage level.

According to the battery monitor system, the control unit switches the battery cells whose noise voltage is to be measured as a measurement target in a time division manner, measures the AC impedance of all the battery cells within a certain period of time, and transmits these measurement results to the higher level system. As a result, the higher level system can grasp the AC impedance measurement results of all battery cells within a certain period of time.

First Embodiment

As shown in FIG. 1, the battery assembly 1 is configured by connecting a plurality of, for example, four battery cells 2(1) to 2(4) in series. The battery cell 2 is, for example, a secondary battery such as a lithium ion battery. The battery assembly monitor device 3 connected to the battery assembly 1 includes a control unit 4, a signal generation unit 5, an excitation signal processing unit 6, a current excitation unit 7, a current measurement unit 8, a voltage measurement unit 9, an impedance measurement unit 10, a noise measurement unit 11, a communication I/F 12, and the like. A current excitation unit 7, a current measurement unit 8 and a voltage measurement unit 9 are provided corresponding to each battery cell 2. The communication I/F 12 is used by the battery assembly monitor device 3 to communicate with a later-described higher level system.

Figure 7:
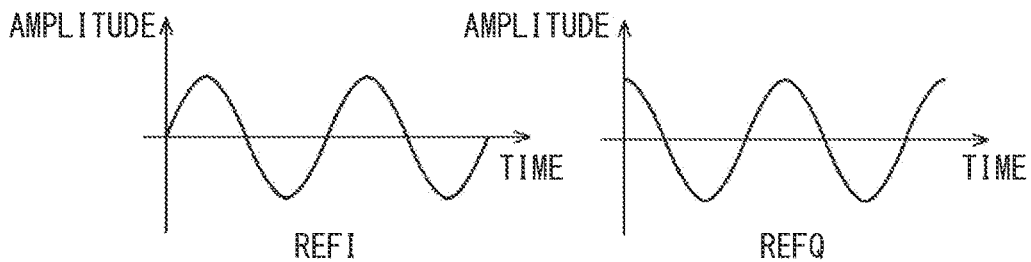
FIG. 7 is a diagram showing waveforms of orthogonal reference signals.

Voltage measurement units 8(1) to 8(4) are connected to the upper and lower electrodes of the battery cells 2(1) to 2(4), respectively. As shown in FIG. 7, the signal generation unit 5 generates orthogonal reference signals REFI and REFQ, which are sine waves and cosine waves having the same frequency as the measurement frequency $f_{LO}$. These orthogonal reference signals REFI and REFQ are output to the current measurement unit 8 and voltage measurement unit 9. Only the reference signal REFI is input to the excitation signal processing unit 6.

Figure 2:
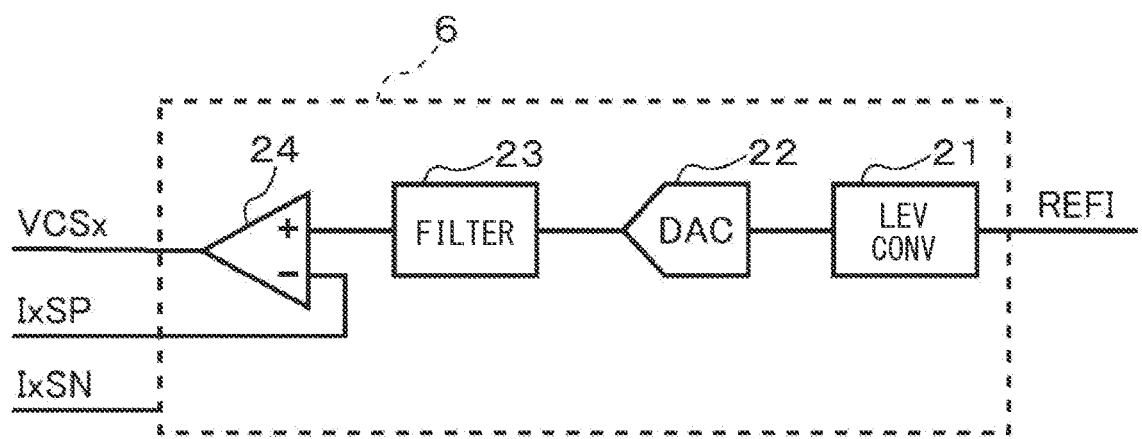
FIG. 2 is a diagram showing the configuration of an excitation signal processing unit.

As shown in FIG. 2, the excitation signal processing unit 6 corresponding to the excitation signal generation unit level-converts the input reference signal REFI according to the target excitation current set by the control unit 4 by the level converter 21, so that a DC offset is obtained, and further converts to an analog voltage signal by the DAC 22. The analog voltage signal is input to the error amplifier 24 after the image component imparted by the demodulation processing is removed through the filter 23.

Figure 8:
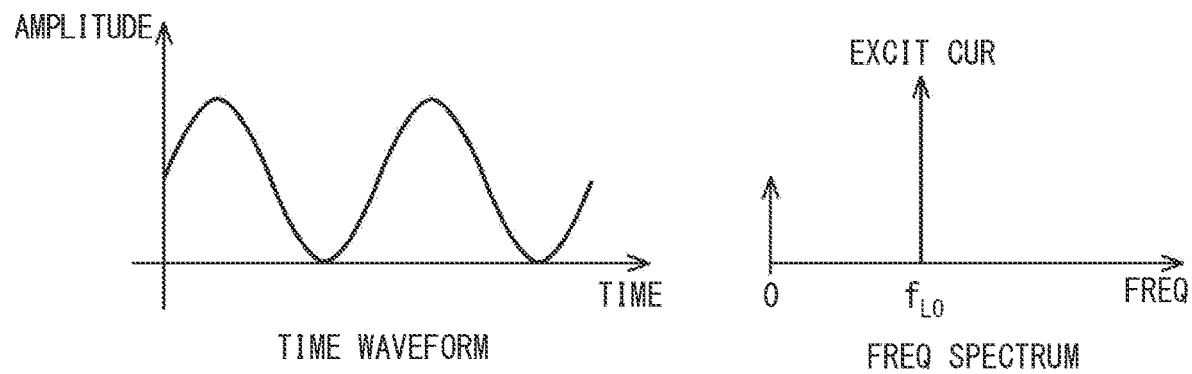
FIG. 8 is a diagram showing the waveform and frequency spectrum of the excitation current.

The voltage signal IxSP from the current excitation unit 7 is input to the inversion input terminal of the error amplifier 24, and the output signal VCSx is controlled so as to match the potential difference from the voltage signal IxSN with the voltage signal applied to the non-inversion input terminal as the control target value. Here, X is equal to 1 to 4. The excitation current output from the current excitation unit 7 is, as shown in FIG. 8, an AC current to which a DC offset is added, and its frequency components include a DC component and the measurement frequency $f_{LO}$ component.

Figure 3:
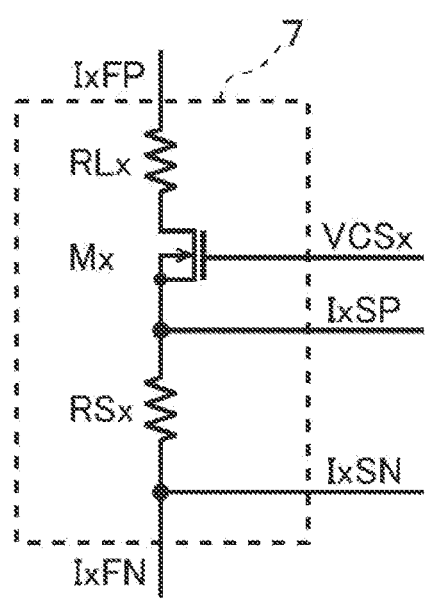
FIG. 3 is a diagram showing the configuration of a current excitation unit.

As shown in FIG. 3, the current excitation unit 7 corresponding to the current generation unit includes a series circuit of a resistance element RLx, an N-channel MOSFET MOSFET_Mx, and a resistance element RSx. The output signal VCSx of the excitation signal processing unit 6 is given to the gate of the FET FET_Mx, and both ends of the resistance element RSx are input to the excitation signal processing unit 6 and the current measurement unit 8 as voltage signals IxSP and IxSN, respectively. Both ends of the series circuit output as excitation current signals IxFP and IxFN. That is, the current excitation unit 7 generates the excitation current signals IxFP and IxFN such that the terminal voltage of the element RSx, which is the sense resistor, matches the control target value.

Figure 4:
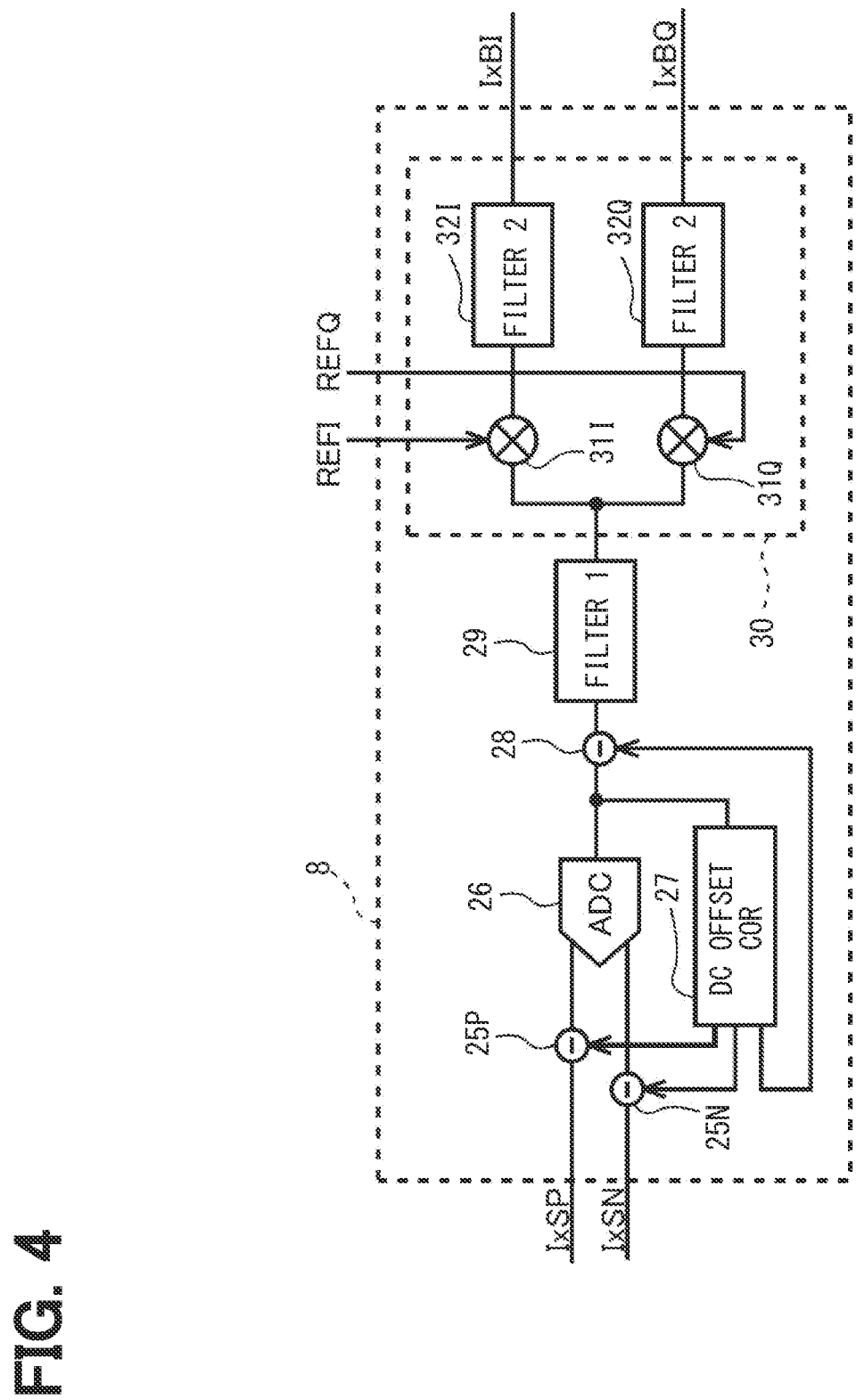
FIG. 4 is a diagram showing the configuration of a current measurement unit.

As shown in FIG. 4, the current measurement unit 8 includes a subtraction units 25P and 25N, an ADC 26, a DC offset correction unit 27, a subtraction unit 28, a filter 29 and an orthogonal demodulator 30. The voltage signals IxSP and IxSN are input to ADC 26 via the subtraction units 25P and 25N, respectively. The voltage data converted by the ADC 26 is input to the DC offset correction unit 27 and the subtraction unit 28. The DC offset correction unit 27 generates a DC offset correction value according to the output data of the ADC 26 and inputs it to the subtraction units 25 and 28.

The output data of the subtraction unit 28 is input to the orthogonal demodulator 30 via the filter 29. The orthogonal demodulator 30 includes multipliers 31I and 31Q and filters 32I and 32Q. The output data of the filter 29 is input to multipliers 31I and 31Q. Reference signals REFI and REFQ are also input to the multipliers 31I and 31Q, respectively, and the orthogonal demodulation is performed by multiplying each input signal. The image components are removed from the output data of the multipliers 31I and 31Q through the filters 32I and 32Q, respectively, to generate data IxBI and IxBQ, which are input to the impedance measurement unit 10 and the noise measurement unit 11, respectively.

Figure 5:
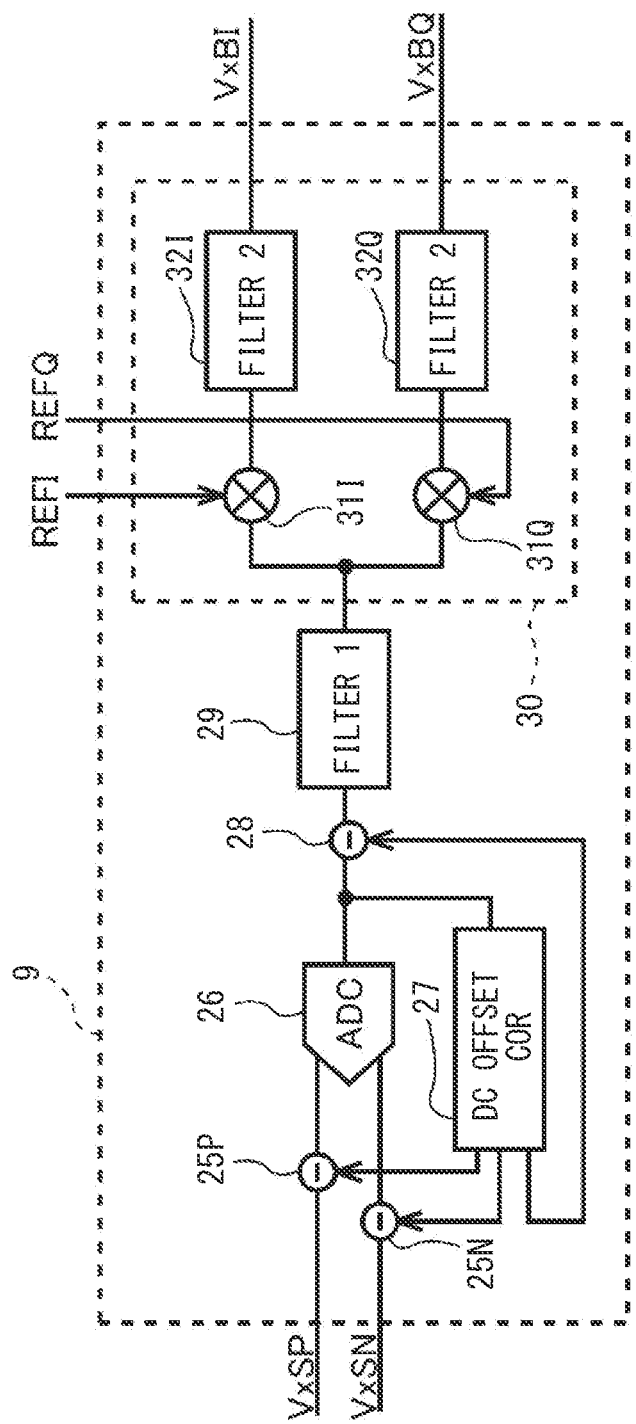
FIG. 5 is a diagram showing the configuration of a voltage measurement unit.

The configuration of the voltage measurement unit 9 is symmetrical to that of the current measurement unit 8, as shown in FIG. 5, and the corresponding configuration element has the same reference numeral. The terminal voltages VxSP and VxSN of the corresponding battery cells 2 are input to the voltage measurement unit 9, and the orthogonal demodulation is performed in the same manner as the current measurement unit 8, data VxBI and VxBQ are generated, and they are input to the impedance measurement unit 10 and noise measurement unit 11. In the electronic monitor device 3, the portion other than the current excitation unit 7 is constructed as an integrated circuit 33.

Figure 9:
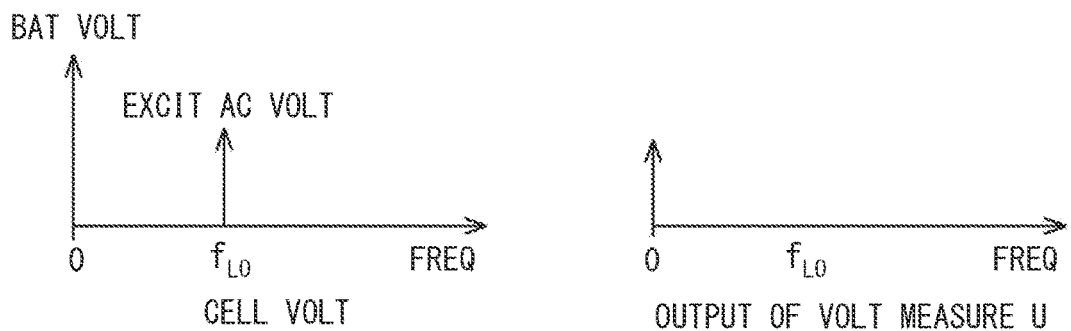
FIG. 9 is a diagram showing the frequency spectrum of the excitation AC voltage in an ideal state and the frequency spectrum of the voltage output from the voltage measurement unit.

When the excitation current is applied to the battery cell 2, it is converted into voltage by the AC impedance. An ideal frequency spectrum of the excitation voltages VxSP and VxSN generated at both ends of the battery cell 2 produces a signal at the DC component and at the measurement frequency $f_{LO}$ as shown in FIG. 9. The DC component is the sum of the product of the voltage of the battery cell 2, the impedance, and the DC offset of the excitation current, and an AC voltage is generated at the frequency $f_{LO}$, which is the product of the AC impedance and the excitation AC current. At this time, the voltage output as the measurement result of the voltage measurement unit 9 is only the DC voltage of the battery cell 2.

Figure 10:
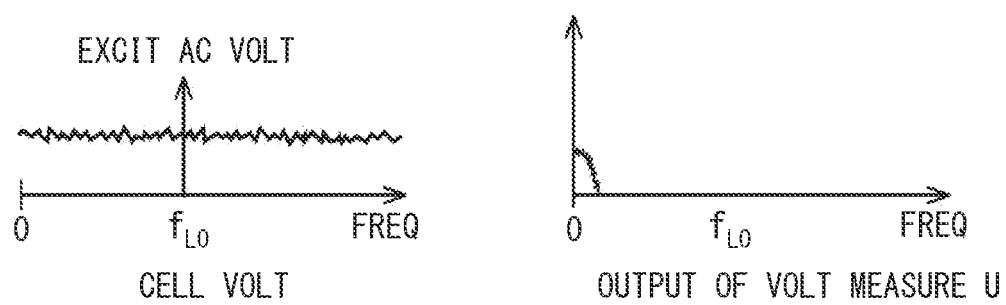
FIG. 10 is a diagram equivalent to FIG. 9 when noise current is superimposed.

On the other hand, as shown in FIG. 10, if the input voltage includes noise due to the noise current flowing, the voltage as the measurement result shows a frequency spectrum with a DC component and a small band around it. Conventionally, this has been a factor of error in impedance measurement.

Figure 6:
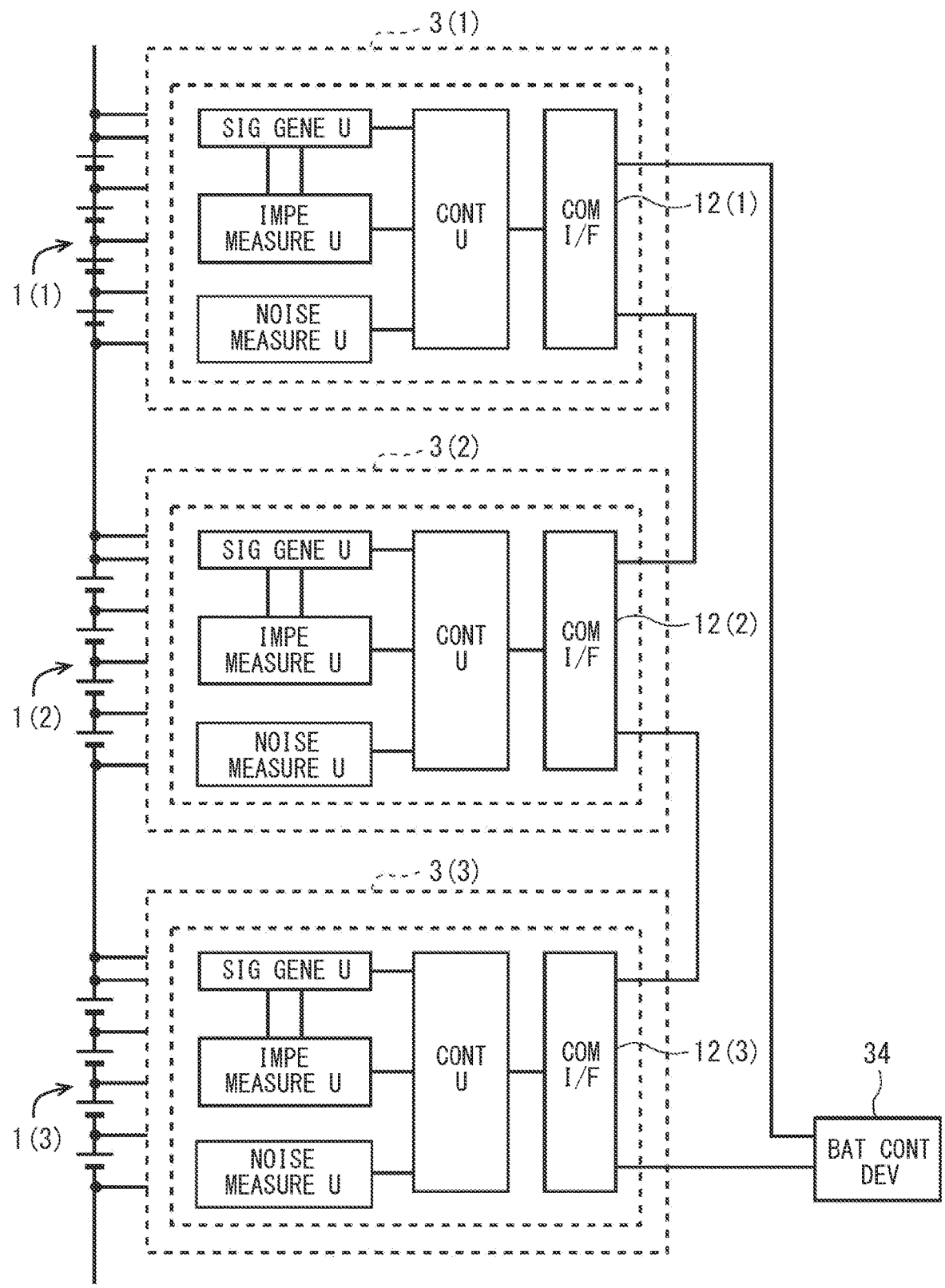
FIG. 6 is a diagram showing an example of a form of communication performed between a plurality of battery monitor devices and a battery control device.

Actually, as shown in FIG. 6, a plurality of battery assemblies 1 are connected in series, and a battery monitor device 3 is connected to each battery assembly 1. A plurality of battery monitor devices 3 communicate with an ECU (i.e., a battery control device 34), which is a higher level system. The battery control device 34 and the communication I/F 12 of each battery monitor device 3 are connected in a daisy chain manner, for example.

Figure 11:
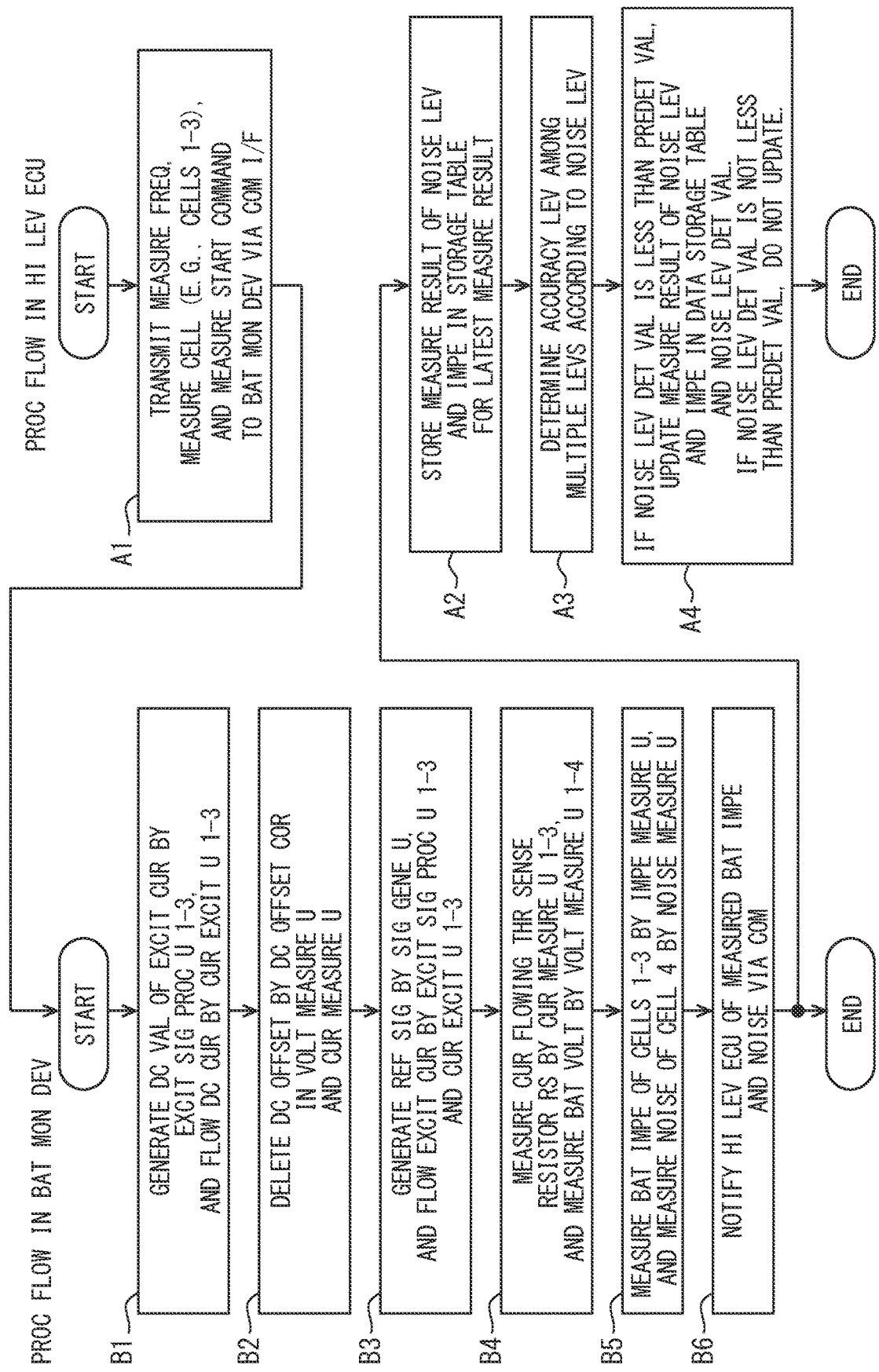
FIG. 11 is a flowchart showing a measurement process by the battery monitor device.

Next, an operation of the present embodiment will be described. An example of measuring the impedance of battery cells 2(1) to 2(3) and measuring the noise in battery cell 2(4) is shown. As shown in FIG. 11, the battery control device 34 transmits to the battery monitor device 3 the measurement frequency fro, the impedance measurement target, in this case, battery cells 2(1) to 2(3) and a measurement start command (at A1).

Upon receiving the measurement start command, the control unit 4 of the battery monitor device 3 causes the excitation signal processing units 6(1) to 6(3) to generate VCSx as a DC voltage value. Then, the current excitation units 7(1) to 7(3) control the voltages IxFP and IxFN so as to apply a DC current corresponding to the voltage value VCSx (at B1).

At this time, signals IxSP and IxSN as DC offsets corresponding to the DC current are input to the current measurement units 8(1) to 8(3) from the current excitation units 7(1) to 7(3). Similarly, terminal voltages VxSP and VxSN of battery cells 2(1) to 2(3) are input as DC offsets to voltage measurement units 9(1) to 9(3), respectively. Current measurement units 8(1) to 8(3) and voltage measurement units 9(1) to 9(3) remove the DC offset included in the input signal by DC offset correction unit 27 (at B2).

Next, the signal generation unit 5 generates orthogonal reference signals REFI and REFQ. The excitation signal processing units 6(1) to 6(3) and the current excitation units 7(1) to 7(3) apply excitation currents according to the reference signal REFI (at B3). The current measurement units 8(1) to 8(3) measure currents flowing through the sense resistors RS of the current excitation units 7(1) to 7(3), and the voltage measurement units 9(1) to 9(4) measure the voltages of the corresponding battery cells 2(1) to 2(4) (at B4).

Figure 12:
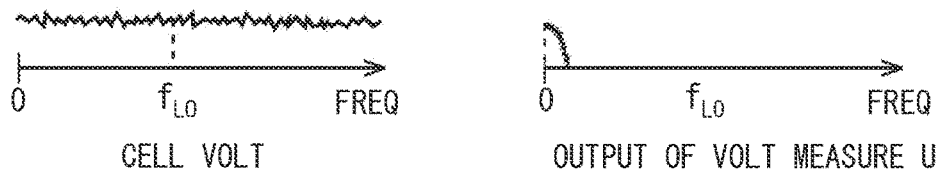
FIG. 12 is a diagram equivalent to FIG. 10 when only the voltage measurement unit is operated.

In this state, the impedance measurement unit 10 measures the impedance of the battery cells 2(1) to 2(3), and the noise measurement unit 11 measures the noise of the battery cell 2(4) (at B5). FIG. 12 shows the voltage measured in this state and the frequency spectrum of the signal output from the noise measurement unit 11. Then, the control unit 4 transmits the measured impedance and noise to the battery control device 34 via the communication I/F 12 (at B6).

The battery control device 34 stores the impedance and noise received from the battery monitor device 3 in a table for storing the latest measurement results (at A2). Then, the accuracy of the measurement result is determined according to the noise level (at A3). When the determination value of the accuracy level is less than the predetermined value, the received impedance and noise measurement results are written and updated in the data storage table together with the determination value. On the other hand, when the determination value is equal to or greater than the predetermined value, the data storage table is not updated (at A4).

As described above, according to the battery assembly monitor device 3 of the present embodiment, the excitation signal processing unit 6 processes the in-phase signal REFI of the orthogonal reference signal generated by the signal generation unit 5 to generate the excitation signal VCSx, and the current excitation unit 7 generates an excitation current based on the excitation signal VCSx by using the voltage signals IxSP and IxSN, and energizes the battery cell 2. The impedance measurement unit 10 measures the alternating-current impedance of the battery cell 2 based on the excitation current measured by the current measurement unit 8 and the voltage of the battery cell 2 measured by the voltage measurement unit 9. The noise measurement unit 11 measures the noise superimposed on the battery cell 2 as a noise voltage based on the same excitation current and the same voltage.

The control unit 4 selects the battery cell 2(4), the AC impedance of which is not to be measured as a measurement target, from among the battery cells 2(1) to 2(4), and measures the noise voltage near the measurement frequency equal to the frequency fro of the orthogonal reference signal using the noise measurement unit 11 under a condition that only the voltage measurement unit 8 is operated without operating the current excitation unit 7 connected to the battery cell 2(4). By controlling in this way, it is possible to measure the impedance of the battery cell 2 and measure the noise voltage in parallel without affecting each other. Therefore, even when the battery assembly 1 is supplying power to the load, it is possible to measure the impedance and the noise voltage with high accuracy.

Then, the control unit 4 transmits the noise voltage of the battery cell 2(4) to the battery control device 34 together with the measurement result of the AC impedance by the impedance measurement unit 10. The battery control device 34 determines the accuracy level of the measurement result according to the level of the noise voltage. When the determination value of the accuracy level is smaller than the predetermined value, the battery control device 34 writes the received measurement result of the impedance and noise together with the determination value in the table for data storage to update the table. But, when the determination value is equal to or greater than the predetermined value, the battery control device 34 does not update the table. In this manner, the battery control device 34 determines whether or not to update the data storage table according to the accuracy level of the measurement result, thereby improving the accuracy of the measurement result.

Second Embodiment

Figure 13:
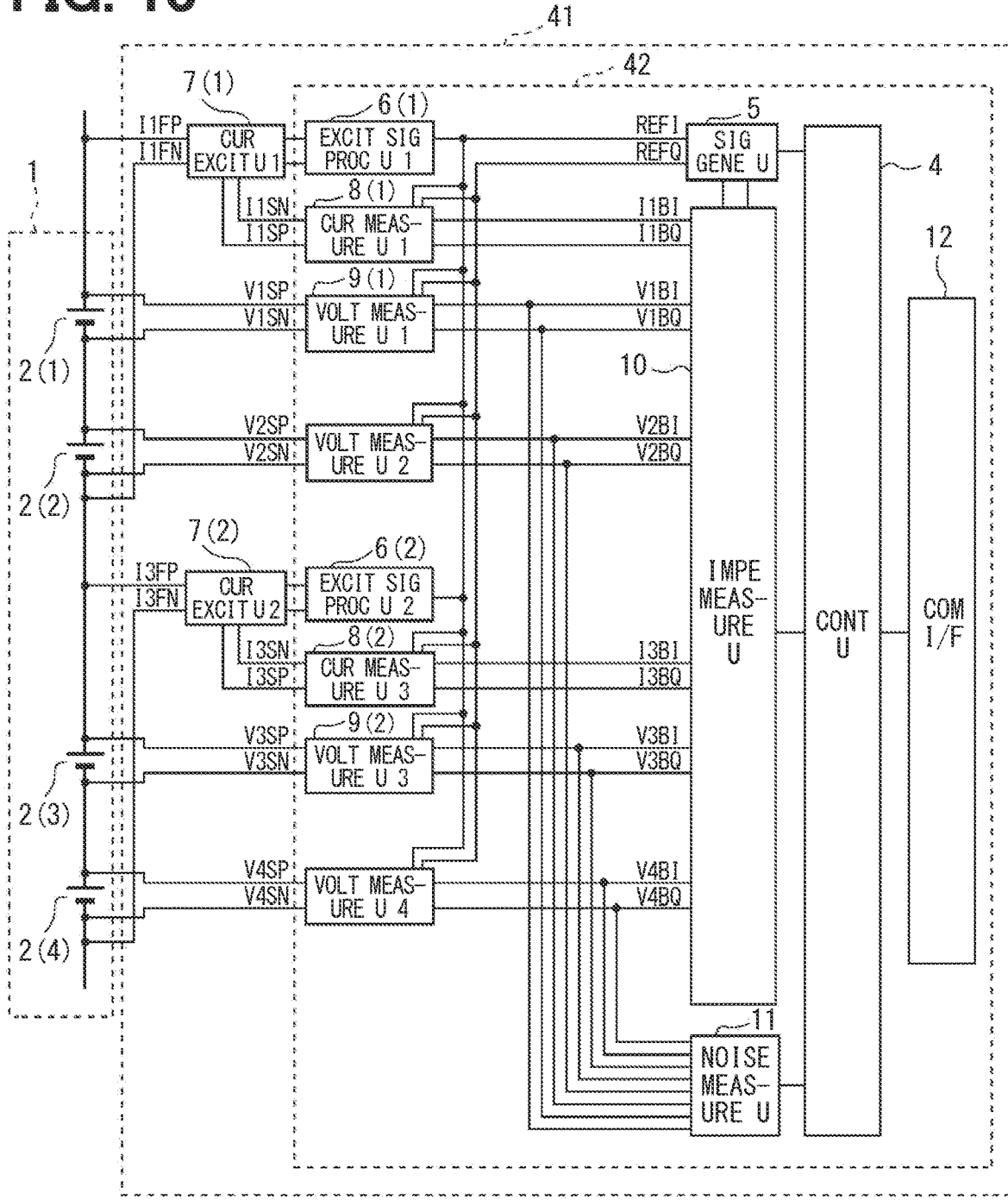
FIG. 13 is a functional block diagram showing the configuration of a battery monitor device in a second embodiment.

Hereinafter, the identical parts as those in the first embodiment will be designated by the same reference numerals for simplification of the description. Only differences from the first embodiment will be described below. As shown in FIG. 13, the battery monitor device 41 of the second embodiment includes a pair of an excitation signal processing unit 6(1) and a current excitation unit 7(1) that energizes the battery cells 2(1) and 2(2) with the excitation current, and a pair of an excitation signal processing unit 6(2) and a current excitation unit 7(2) that energizes the battery cells 2(3) and 2(4) with the excitation current. Then, the current measurement unit 8(1) measures the excitation current flowing through the battery cells 2(1) and 2(2), and the current measurement unit 8(2) measures the excitation current flowing through the battery cells 2(3) and 2(4). A portion of the battery monitor device 41 excluding the current excitation unit 7 is configured as an integrated circuit 42.

According to the second embodiment configured as described above, the excitation current can be energized to the battery cells 2(1) to 2(4) and measured only by using two sets of the excitation signal processing unit 6, the current excitation unit 7, and the current measurement unit 8, so that the circuit area can be reduced.

Third Embodiment

Figure 14:
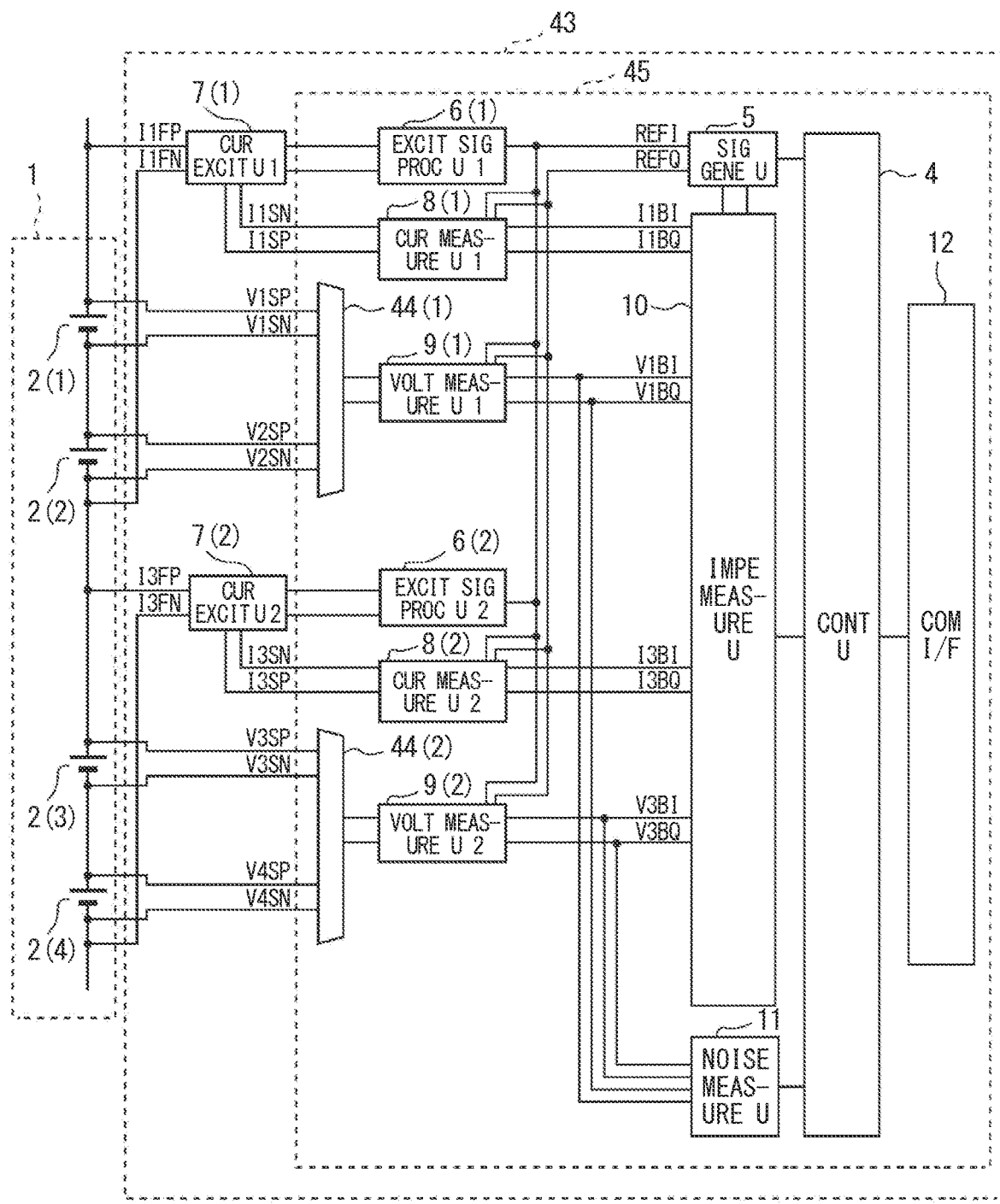
FIG. 14 is a functional block diagram showing the configuration of a battery monitor device in a third embodiment.

As shown in FIG. 14, in the battery monitor device 43 of the third embodiment, the battery monitor device 41 is modified, and only measurement units 9(1) and 9(2) are used for voltage measurement. Then, the selector 44(1) is arranged between the battery cells 2(1) and 2(2) and the voltage measurement unit 9(1), and the selector 44(2) is arranged between the battery cells 2(3) and 2(4) and the voltage measurement unit 9(2). Switching of the selector 44 is controlled by the control unit 4.

That is, the voltage measurement of the battery cells 2(1) and 2(2) is performed by the voltage measurement unit 9(1) by switching the selector 44(1), and the voltage measurement of the battery cells 2(3) and 2(4) is performed by the voltage measurement unit 9(2) by switching the selector 44(2). A portion of the battery monitor device 43 excluding the current excitation unit 7 is configured as an integrated circuit 45. According to the third embodiment configured as described above, the circuit area can be further reduced.

Fourth Embodiment

Figure 15:
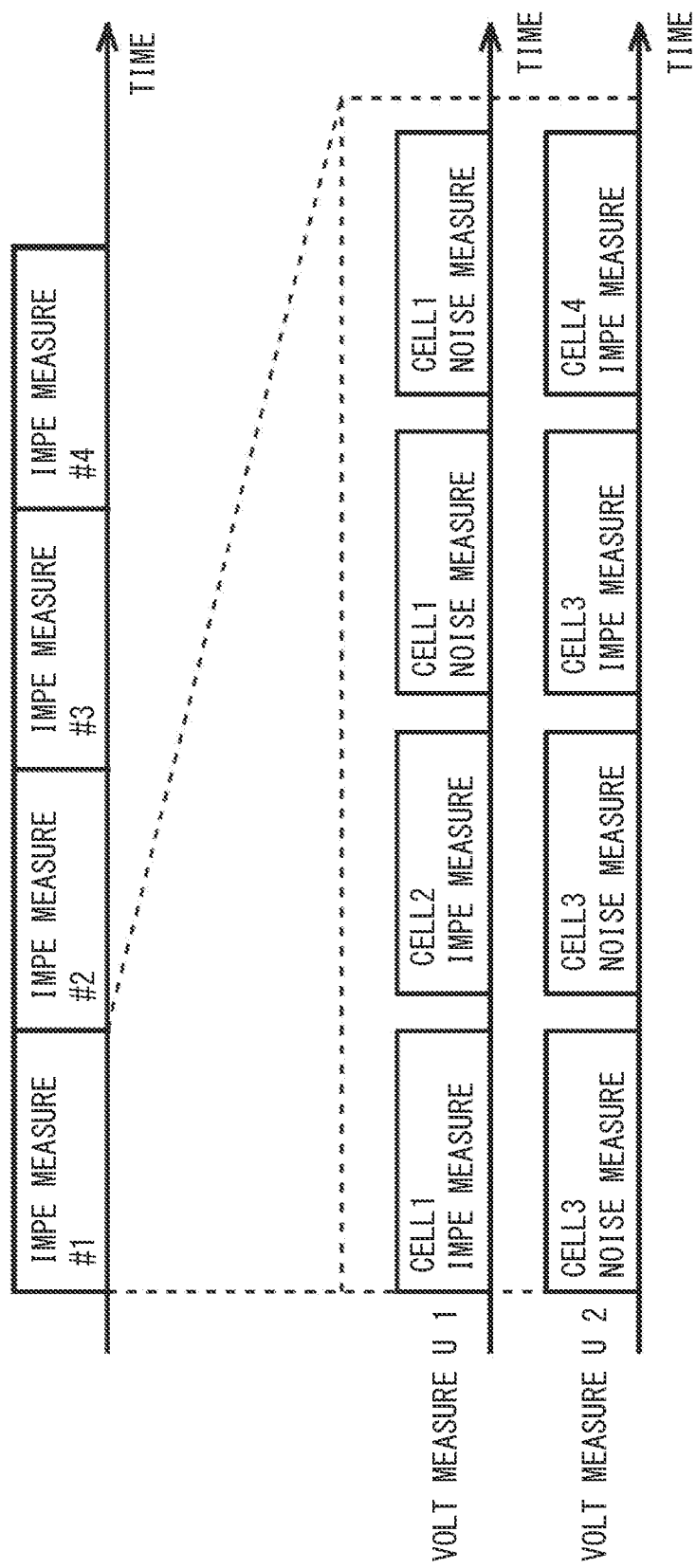
FIG. 15 is a timing chart showing an example of a control mode when impedance and noise are measured by the battery monitor device of the third embodiment according to the fourth embodiment.

A fourth embodiment shown in FIG. 15 is an example of a control mode when impedance and noise are measured by the battery monitor device 43 of the third embodiment. "Impedance measurements #1 to #4" indicate that all measurements are performed in the same manner, and only the contents of "impedance measurement #1" are shown. There are four measurement phases. In the first phase, the control unit 4 measures the impedance of the battery cell 2(1) with the voltage measurement unit 9(1) and measures the noise of the battery cell 2(3) with the voltage measurement unit 9(2). In the next second phase, the voltage measurement unit 9(1) measures the impedance of the battery cell 2(2), and the voltage measurement unit 9(2) similarly measures the noise of the battery cell 2(3).

In the subsequent third phase, the voltage measurement unit 9(1) measures the noise of the battery cell 2(1), and the voltage measurement unit 9(2) measures the impedance of the battery cell 2(3). In the next fourth phase, the voltage measurement unit 9(1) measures the noise of the battery cell 2(2), and the voltage measurement unit 9(2) similarly measures the impedance of the battery cell 2(4). The measured impedances and noise voltages of the battery cells 2(1) to 2(4) are sent to the battery control device 34. This feature of measurement is repeated in sequence.

As described above, according to the fourth embodiment, the control unit 4 switches the battery cells 2 as the measurement target of the noise voltage in a time division manner, measures the AC impedance of all the battery cells 2 within a certain period of time, and transmits these measurement results to the battery control device 34. Thereby, the battery control device 34 can grasp the measurement results of the AC impedance and the noise voltage of all the battery cells 2 within a certain period of time.

Fifth Embodiment

Figure 16:
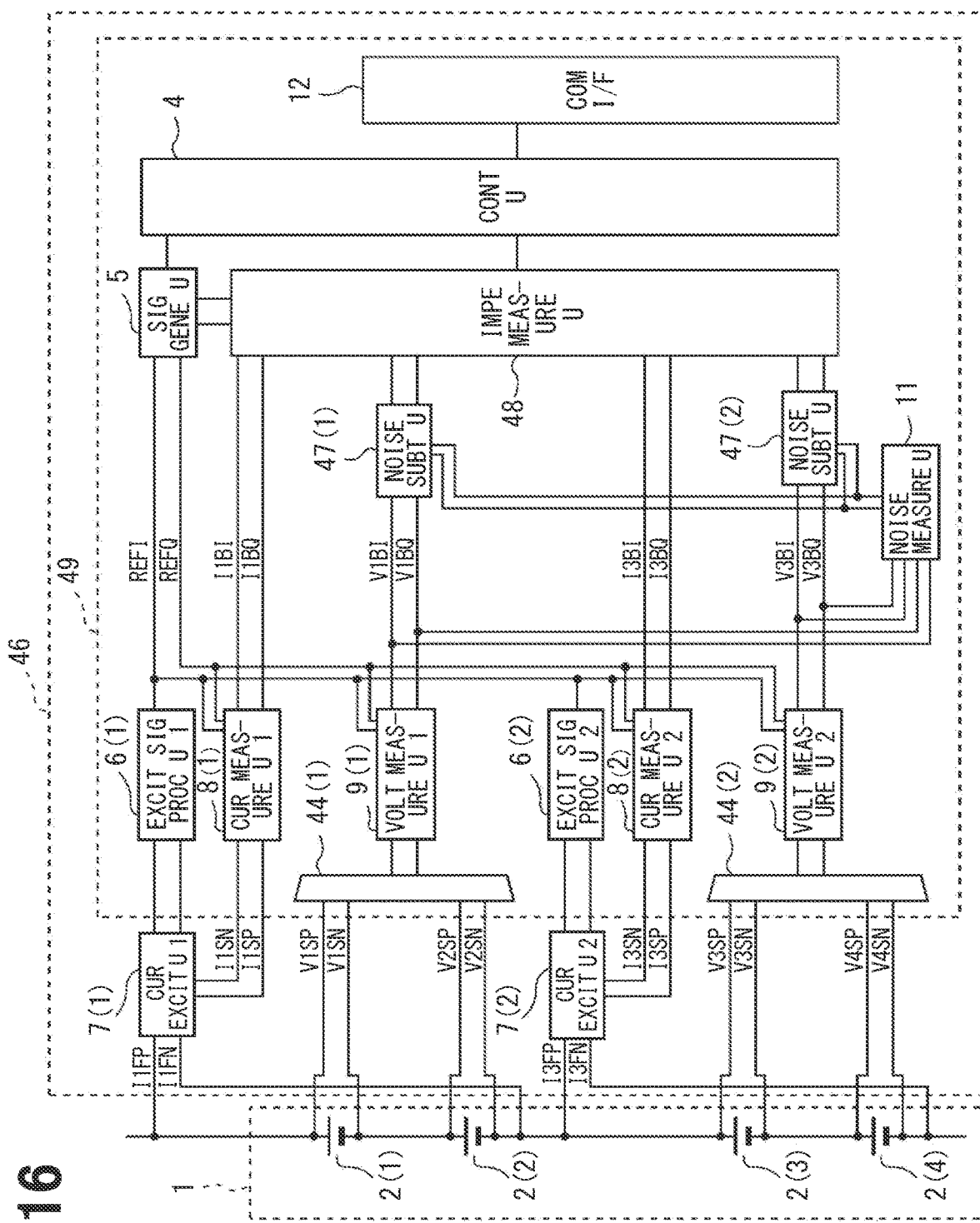
FIG. 16 is a functional block diagram showing the configuration of a battery monitor device in a fifth embodiment.

As shown in FIG. 16, the battery monitor device 46 of the fifth embodiment is a modification of the battery monitor device 41, in which the output signal of the noise measurement unit 11 is input into the noise subtraction units 47(1) and 47(2), and the output signals of the noise subtraction units 47(1) and 47(2) are input to the impedance measurement unit 48. A portion of the battery monitor device 46 excluding the current excitation unit 7 is configured as an integrated circuit 49.

Figure 17:
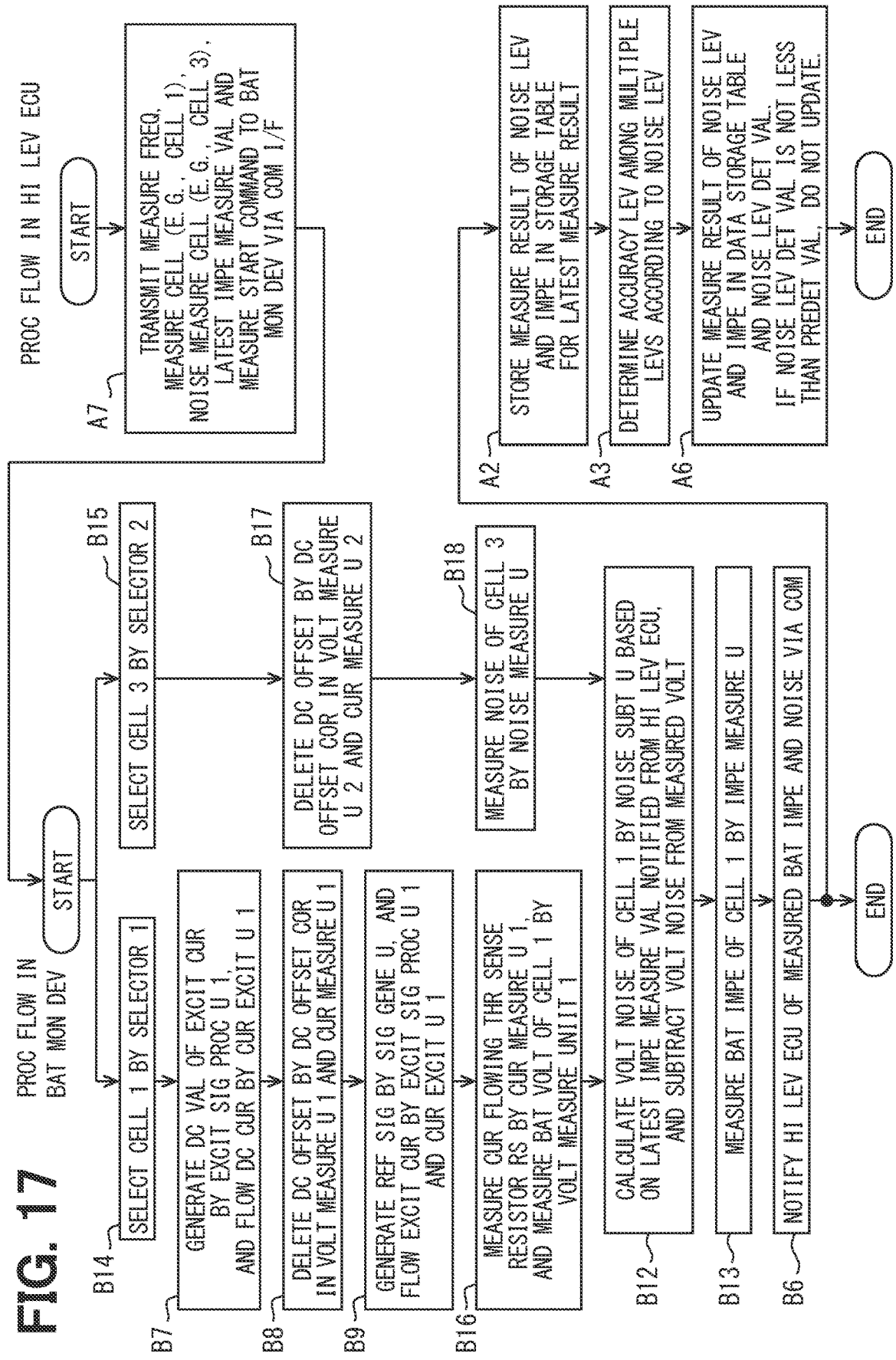
FIG. 17 is a flowchart showing a measurement process by the battery monitor device.

Next, operation of the fifth embodiment will be described. An example of measuring the impedance of battery cell 2(1) and measuring the noise in battery cell 2(3) is shown. As shown in FIG. 17, the battery control device 34 transmits the measurement frequency fro, the information about the measurement target, in this case, the battery cells 2(1) and 2(3), the latest information of the battery cell 2(1), that is the previous impedance measurement value of the battery cell 2(1), and the measurement start command to the battery monitor device 3 (at A5).

Upon receiving the measurement start command, the control unit 4 of the battery monitor device 46 causes the excitation signal processing units 6(1) to generate VCSx as a DC voltage value. Then, the current excitation unit 7(1) control the voltages IxFP and IxFN so as to apply a DC current corresponding to the voltage value VCSx (at B7). Note that the latest impedance measurement value is transferred to the noise subtraction unit 47. Similar to the first embodiment, the current measurement unit 8(1) and voltage measurement unit 9(1) remove the DC offset included in the input signal by DC offset correction unit 27 (at B8).

Next, the signal generation unit 5 generates orthogonal reference signals REFI and REFQ. The excitation signal processing unit 6(1) and the current excitation unit 7(1) apply excitation currents according to the reference signal REFI (at B9). The current measurement unit 8(1) measures the current flowing through the sense resistor RS of the current excitation unit 7(1), selects the battery cell 2(1) with the selector 44(1), and selects the battery cell 2(3) with the selector 44(2). The voltage measurement units 9(1) and 9(2) measure voltages V1 and V3 of battery cells 2(1) and 2(3), respectively (at B10).

Figure 18:
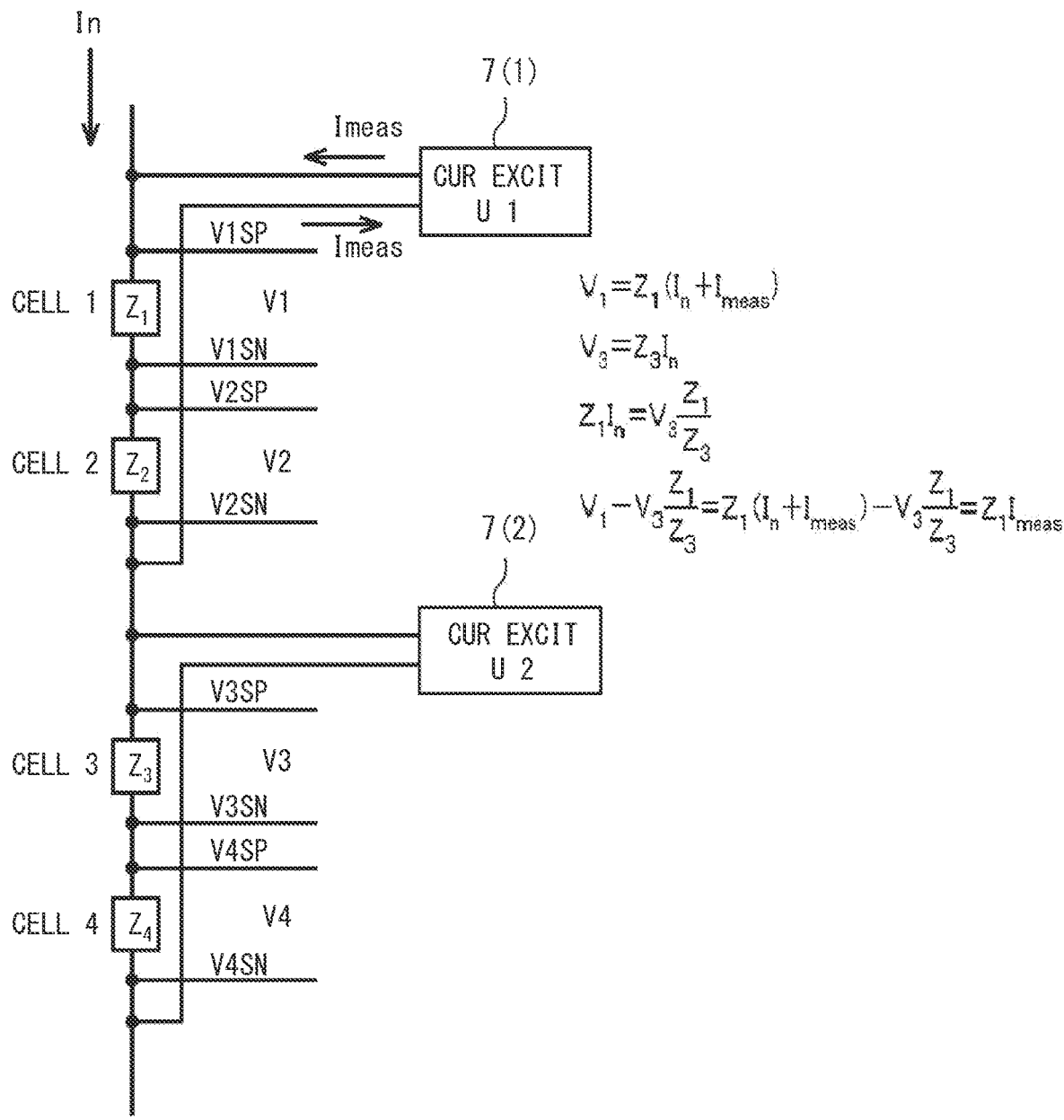
FIG. 18 is a diagram for explaining impedance measurement in an impedance measurement unit.

In this state, the noise measurement unit 11 measures the noise of the battery cell 2(3) (at B11). The noise subtraction unit 47 calculates the noise voltage of the battery cell 2(1) from the latest impedance measurement values Z1 and Z3 notified from the battery control device 34, and subtracts it from the measured voltage V1 (at B12). Processing here will be described with reference to FIG. 18.

The impedances of the battery cells 2(1) and 2(3) are defined as Z1 and Z3, the excitation current is defined as Imeas, and the noise current is defined as In. The voltages V1 and V3 of the battery cells 2(1) and 2(3) are given below.

$$V1 = Z1(In + Imeas)$$

$$V3 = Z3 \times In$$

The product of the impedance Z1 and the noise current In is expressed as follows from the latest measured values.

$$Z1 \times In = V3 \times Z1/Z3$$

When subtracting the product of (Z1·In) from the measured voltage V1, the product of the impedance Z1 and the excitation current Imeas is obtained.

$$V1 - V3 \times Z1/Z3 = V1 = Z1(In + Imeas) - V3 \times Z1/Z3 = Z1 \times Imeas$$

In subsequent step B13, the impedance measurement unit 10 obtains the impedance Z1 of the battery cell 2(1) by dividing the product of (Z1·Imeas) by the excitation current Imeas. Then, the control unit 4 transmits the measured impedance and noise to the battery control device 34 via the communication I/F 12 (at B6).

After the battery control device 34 executes steps A2 and A3, the received impedance and noise measurement results are written and updated in the data storage table together with the accuracy level determination value, but, when the determination value is equal to or larger than the predetermined value, the data storage table is not updated (at A6).

Based on the frequency list, the battery control device 34 executes the processing shown in FIG. 17 while changing the frequency, thereby creating a data table showing impedance values and noise values at each frequency as shown in FIG. 19. Thereby, the battery control device 34 can obtain the frequency with a high noise level.

As described above, according to the fifth embodiment, the noise subtraction unit 47 is arranged between the voltage measurement unit 9 and the impedance measurement unit 48, and the noise subtraction unit 47 subtracts the value of (V3·Z1/Z3), corresponding to the result obtained by multiplying a certain battery cell 2 as the measurement target by the measurement result Z1 of the AC impedance measured last time, from the voltage V1 output from the voltage measurement unit 9(1). Thereby, the impedance measurement unit 48 can obtain the impedance Z1 of the battery cell 2(1) by eliminating the influence of the noise current In.

Sixth Embodiment

Figure 20:
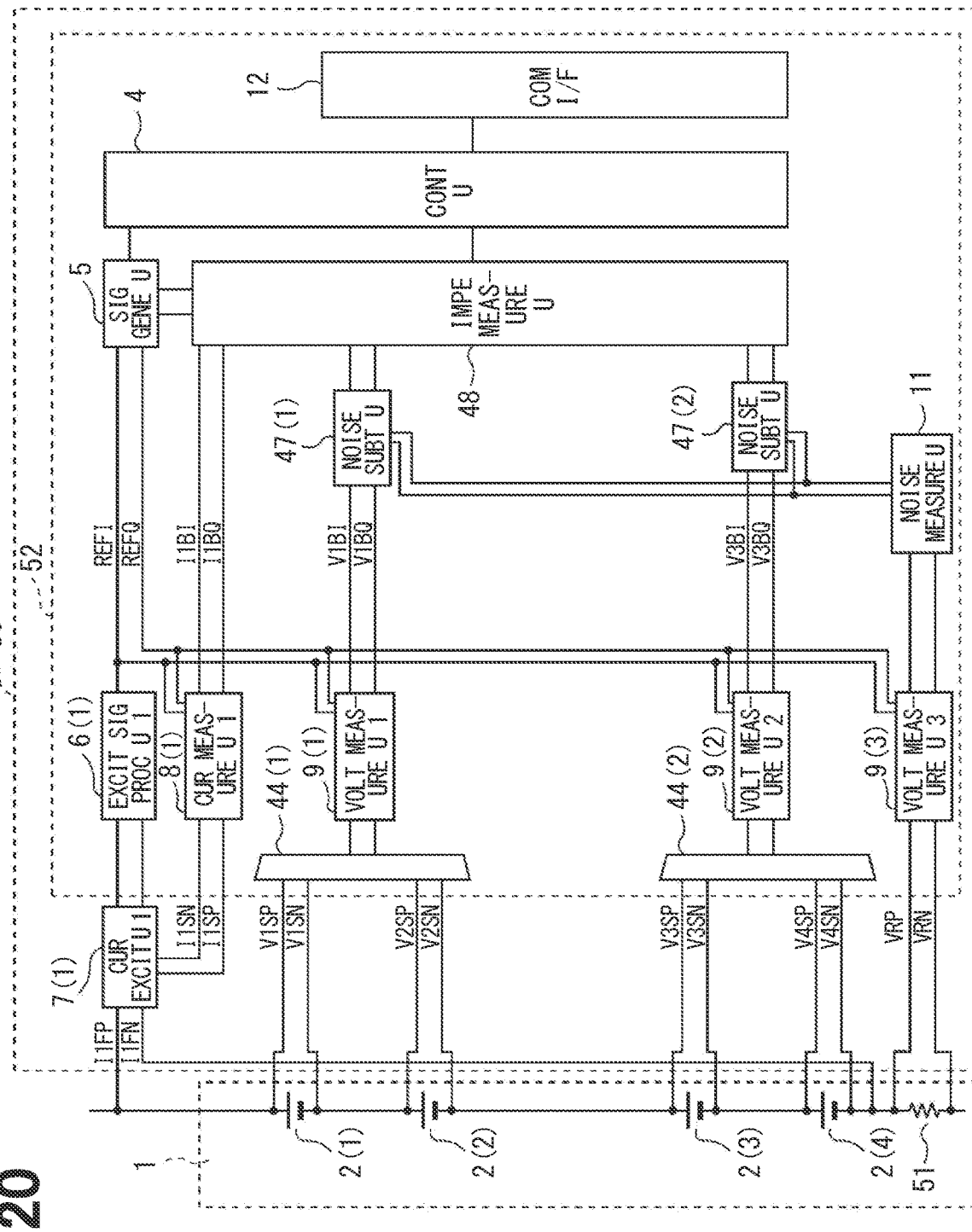
FIG. 20 is a functional block diagram showing the configuration of a battery monitor device in a sixth embodiment.

As shown in FIG. 20, the battery monitor device 50 of the sixth embodiment is prepared by modifying the battery monitor device 46. A resistance element 51 for noise measurement is connected to the low potential side of the battery cell 2(4), and the terminal voltage of the resistance element 51 is measured by the voltage measurement unit 9(3). The measurement result of the voltage measurement unit 9(3) is input to the noise measurement unit 11. A portion of the battery monitor device 46 excluding the current excitation unit 7 is configured as an integrated circuit 52. The voltage measurement units 9(1) and 9(2) correspond to the cell voltage measurement unit, and the voltage measurement unit 9(3) corresponds to the resistance voltage measurement unit.

According to the sixth embodiment configured as described above, the voltage measurement units 9(1) and 9(2) measure the voltage of the battery cells 2, and the voltage measurement unit 9(3) measures the voltage of the resistance element 51 connected in series to the plurality of battery cells 2. Then, the control unit 4 operates the voltage measurement unit 9 (3) without operating the current excitation unit 7 to measure the noise voltage. Even in this configuration, it is possible to measure the impedance of the battery cell 2 and the noise voltage in parallel without affecting each other.

Seventh Embodiment

Figure 21:
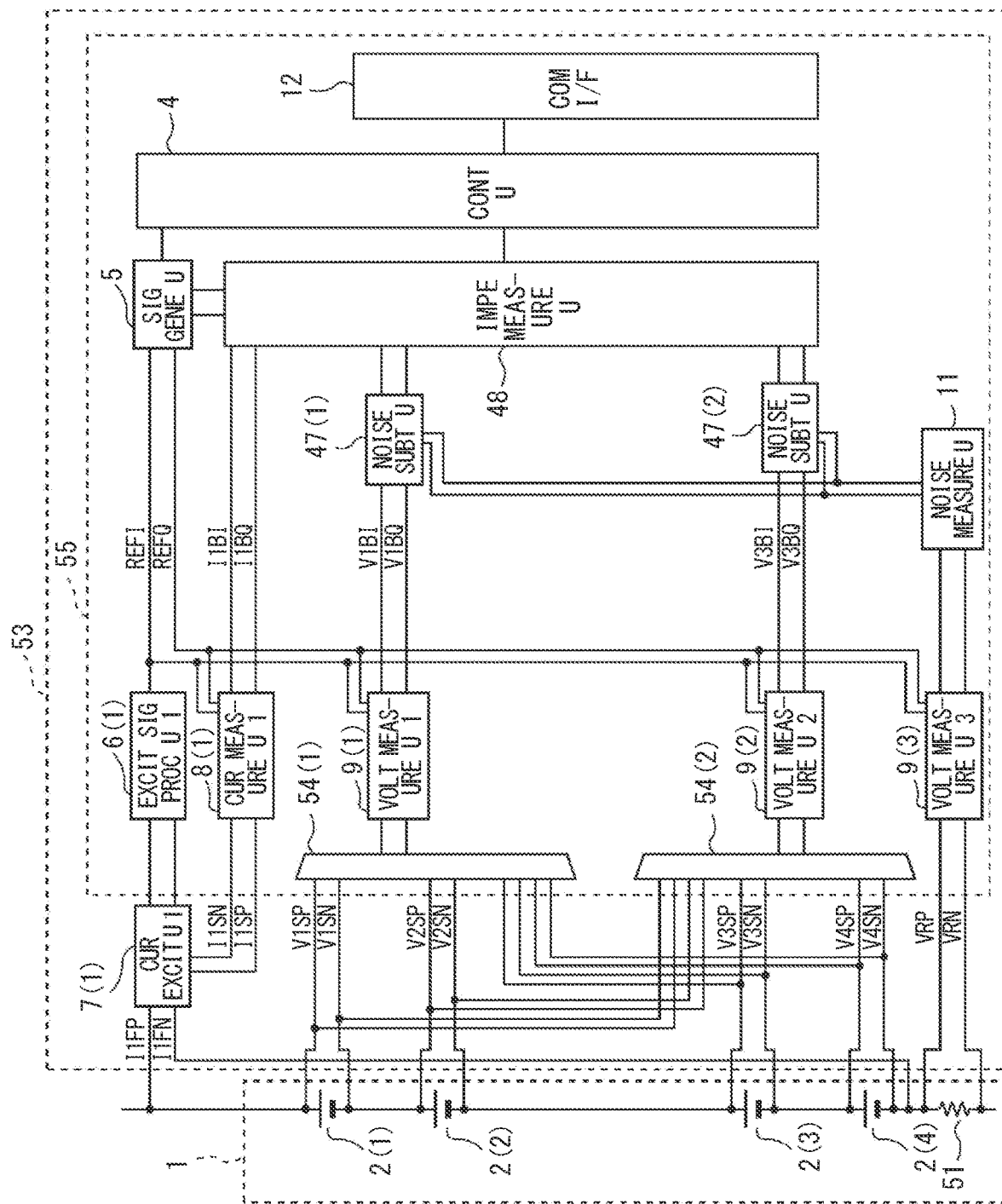
FIG. 21 is a functional block diagram showing the configuration of a battery monitor device in a seventh embodiment.

As shown in FIG. 21, the battery monitor device 53 of the seventh embodiment is prepared by modifying the battery monitor device 50. The selectors 54(1) and 54(2) are arranged in place of the selectors 44(1) and 44(2). Each terminal voltage of the battery cells 2(1) to 2(4) can be switched and input into the selectors 54(1) and 54(2), respectively. A portion of the battery monitor device 53 excluding the current excitation unit 7 is configured as an integrated circuit 55.

With this configuration, for example, it is possible to control such that the selector 54(1) selects the battery cell 2(1), constantly measures the impedance of the battery cell 2(1), and the selector 54(2) switches and measures the impedance of the other battery cells 2(2) to 2(4) in a time-sharing manner. In this way, for example, when the impedance at a frequency of 100 Hz varies by 20% or more from its average value, it is possible to select the battery cell 2 to be monitored intensively and constantly measure the impedance.

As described above, according to the seventh embodiment, two sets of the voltage measurement unit 9 and the selector 54 are provided, and each of the selectors 54(1) and 54(2) switches the voltage of all the battery cells 2(1) to 2(4) to be measured. As a result, for example, it is possible to execute the measurement control such that the selector 54(1) fixedly selects the cell 2(1) to be monitored intensively and performs high-speed measurement, and the voltages of the other normal battery cells 2(2) to 2(4) are sequentially switched by the selector 54(2) to measure the voltage with low speed.

Other Embodiments

The number of battery cells 2 may not be limited to "4" and may be any number as long as the number is more than one.

The feature of communication performed between a plurality of battery monitor devices and the battery control device may not be limited to the daisy chain connection, and may employ a bus method, a round robin method, wireless communication, or the like.

The selection of the measurement mode of the battery cell 2 using the selectors 54(1) and 54(2) performed in the seventh embodiment may be applied to other embodiments.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes sections (also referred to as steps), each of which is represented, for instance, as A1. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A battery monitor system for monitoring a battery state of a plurality of battery cells, the battery monitor system comprising:
    a reference signal generation unit that generates an alternating-current orthogonal reference signal;
    an excitation signal generation unit that processes an in-phase signal of the orthogonal reference signal to generate an excitation signal;
    a current generation unit that generates an excitation current based on the excitation signal and energizes each battery cell;
    a current measurement unit that measures the excitation current generated by the current generation unit;
    a voltage measurement unit that measures a voltage of each battery cell;
    an impedance measurement unit that measures an alternating-current impedance of each battery cell based on the excitation current measured by the current measurement unit and the voltage measured by the voltage measurement unit;
    a noise measurement unit that measures a noise superimposed on each battery cell as a noise voltage based on the voltage measured by the voltage measurement unit and estimates a noise current;
    a control unit that controls a measurement of the alternating-current impedance and a measurement of the noise voltage; and
    a higher level system that communicates with the control unit,
    wherein:
    the control unit selects one or more battery cells that are not a measurement target of the alternating-current impedance from among the plurality of battery cells;
    the noise measurement unit measures the noise voltage near a measurement frequency equal to a frequency of the orthogonal reference signal while the current generation unit connected to selected one or more battery cells is not operated and only the voltage measurement unit is operated;
    the control unit transmits the noise voltage measured by the noise measurement unit to the higher level system together with a measurement result of the alternating-current impedance by the impedance measurement unit; and
    the higher level system determines an accuracy level of the measurement result based on a received noise voltage, and determines whether the measurement result is valid.

2. The battery monitor system according to claim 1, wherein:
    the control unit switches the battery cells as a measurement target of the noise voltage in a time division manner, measures the alternating-current impedance of all the battery cells within a predetermined period of time, and transmits a measurement result to a higher level system.

3. The battery monitor system according to claim 1, wherein:
    the current generation unit is configured to apply an excitation current to two or more battery cells connected in series.

4. The battery monitor system according to claim 1, further comprising:
    a selector that switches and measures voltages of two or more battery cells with the voltage measurement unit.

5. A battery monitor system for monitoring a battery state of a plurality of battery cells, the battery monitor system comprising:
    a reference signal generation unit that generates an alternating-current orthogonal reference signal;
    an excitation signal generation unit that processes an in-phase signal of the orthogonal reference signal to generate an excitation signal;
    a current generation unit that generates an excitation current based on the excitation signal and energizes each battery cell;
    a current measurement unit that measures the excitation current generated by the current generation unit;
    a voltage measurement unit that measures a voltage of each battery cell;
    an impedance measurement unit that measures an alternating-current impedance of each battery cell based on the excitation current measured by the current measurement unit and the voltage measured by the voltage measurement unit;
    a noise measurement unit that measures a noise superimposed on each battery cell as a noise voltage based on the voltage measured by the voltage measurement unit and estimates a noise current;
    a control unit that controls a measurement of the alternating-current impedance and a measurement of the noise voltage;
    a selector that switches and measures voltages of two or more battery cells with the voltage measurement unit; and
    another one set of the voltage measurement unit and the selector,
    wherein:
    the control unit selects one or more battery cells that are not a measurement target of the alternating-current impedance from among the plurality of battery cells;

the noise measurement unit measures the noise voltage near a measurement frequency equal to a frequency of the orthogonal reference signal while the current generation unit connected to selected one or more battery cells is not operated and only the voltage measurement unit is operated; and each selector is configured to switch and measure voltages of all battery cells.

6. A battery monitor system for monitoring a battery state of a plurality of battery cells, the battery monitor system comprising:

a reference signal generation unit that generates an alternating-current orthogonal reference signal;

an excitation signal generation unit that processes an in-phase signal of the orthogonal reference signal to generate an excitation signal;

a current generation unit that generates an excitation current based on the excitation signal and energizes each battery cell;

a current measurement unit that measures the excitation current generated by the current generation unit;

a voltage measurement unit that measures a voltage of each battery cell;

an impedance measurement unit that measures an alternating-current impedance of each battery cell based on the excitation current measured by the current measurement unit and the voltage measured by the voltage measurement unit;

a noise measurement unit that measures a noise superimposed on each battery cell as a noise voltage based on the voltage measured by the voltage measurement unit and estimates a noise current;

a control unit that controls a measurement of the alternating-current impedance and a measurement of the noise voltage; and a noise level subtraction unit arranged between the voltage measurement unit and the impedance measurement unit, wherein:

the control unit selects one or more battery cells that are not a measurement target of the alternating-current impedance from among the plurality of battery cells;

the noise measurement unit measures the noise voltage near a measurement frequency equal to a frequency of the orthogonal reference signal while the current generation unit connected to selected one or more battery cells is not operated and only the voltage measurement unit is operated; and the noise level subtraction unit subtracts a value, corresponding to a result of multiplying an estimated noise current by a measurement result of the alternating-current impedance previously measured for the battery cell as a measurement target, from a voltage output from the voltage measurement unit.

7. The battery monitor system according to claim 1, wherein:

the control unit causes the noise measurement unit to measure the noise while sweeping a frequency as a measurement target; and a higher level system generates a data table showing a noise value at each frequency.

8. A battery monitor system for monitoring a battery state of a plurality of battery cells, the battery monitor system comprising:

a reference signal generation unit that generates an alternating-current orthogonal reference signal;

an excitation signal generation unit that processes an in-phase signal of the orthogonal reference signal to generate an excitation signal;

a current generation unit that generates an excitation current based on the excitation signal and energizes each battery cell;

a current measurement unit that measures the excitation current generated by the current generation unit;

a cell voltage measurement unit that measures a voltage of each battery cell;

a resistance voltage measurement unit that measures a voltage of a resistance element connected in series to the plurality of battery cells;

an impedance measurement unit that measures an alternating-current impedance of each battery cell based on the excitation current measured by the current measurement unit and the voltage measured by the voltage measurement unit;

a noise measurement unit that measures a noise superimposed on each battery cell as a noise voltage based on the voltage measured by the resistance voltage measurement unit and estimates a noise current;

a control unit that controls a measurement of the alternating-current impedance and a measurement of the noise voltage; and a higher level system that communicates with the control unit, wherein:

the control unit controls the noise measurement unit to measure the noise voltage near a measurement frequency equal to a frequency of the orthogonal reference signal while the current generation unit is not operated and the resistance voltage measurement unit is operated;

the control unit transmits the noise voltage measured by the noise measurement unit to the higher level system together with a measurement result of the alternating-current impedance by the impedance measurement unit; and the higher level system determines an accuracy level of the measurement result based on a received noise voltage, and determines whether the measurement result is valid.

9. The battery monitor system according to claim 8, wherein:

the control unit switches the battery cells as a measurement target of the noise voltage in a time division manner, measures the alternating-current impedance of all the battery cells within a predetermined period of time, and transmits a measurement result to a higher level system.

10. The battery monitor system according to claim 8, wherein:

the current generation unit is configured to apply an excitation current to two or more battery cells connected in series.

11. The battery monitor system according to claim 8, further comprising:

a selector that switches and measures voltages of two or more battery cells with the voltage measurement unit.

12. A battery monitor system for monitoring a battery state of a plurality of battery cells, the battery monitor system comprising:

a reference signal generation unit that generates an alternating-current orthogonal reference signal;

an excitation signal generation unit that processes an in-phase signal of the orthogonal reference signal to generate an excitation signal;
a current generation unit that generates an excitation current based on the excitation signal and energizes each battery cell;
a current measurement unit that measures the excitation current generated by the current generation unit;
a cell voltage measurement unit that measures a voltage of each battery cell;
a resistance voltage measurement unit that measures a voltage of a resistance element connected in series to the plurality of battery cells;
an impedance measurement unit that measures an alternating-current impedance of each battery cell based on the excitation current measured by the current measurement unit and the voltage measured by the voltage measurement unit;
a noise measurement unit that measures a noise superimposed on each battery cell as a noise voltage based on the voltage measured by the resistance voltage measurement unit and estimates a noise current;
a control unit that controls a measurement of the alternating-current impedance and a measurement of the noise voltage;
a selector that switches and measures voltages of two or more battery cells with the voltage measurement unit; and
another one set of the voltage measurement unit and the selector,
wherein:
the control unit controls the noise measurement unit to measure the noise voltage near a measurement frequency equal to a frequency of the orthogonal reference signal while the current generation unit is not operated and the resistance voltage measurement unit is operated; and
each selector is configured to switch and measure voltages of all battery cells.

13. A battery monitor system for monitoring a battery state of a plurality of battery cells, the battery monitor system comprising:
a reference signal generation unit that generates an alternating-current orthogonal reference signal;
an excitation signal generation unit that processes an in-phase signal of the orthogonal reference signal to generate an excitation signal;
a current generation unit that generates an excitation current based on the excitation signal and energizes each battery cell;
a current measurement unit that measures the excitation current generated by the current generation unit;
a cell voltage measurement unit that measures a voltage of each battery cell;
a resistance voltage measurement unit that measures a voltage of a resistance element connected in series to the plurality of battery cells;
an impedance measurement unit that measures an alternating-current impedance of each battery cell based on the excitation current measured by the current measurement unit and the voltage measured by the voltage measurement unit;
a noise measurement unit that measures a noise superimposed on each battery cell as a noise voltage based on the voltage measured by the resistance voltage measurement unit and estimates a noise current;
a control unit that controls a measurement of the alternating-current impedance and a measurement of the noise voltage; and
a noise level subtraction unit arranged between the voltage measurement unit and the impedance measurement unit,
wherein:
the control unit controls the noise measurement unit to measure the noise voltage near a measurement frequency equal to a frequency of the orthogonal reference signal while the current generation unit is not operated and the resistance voltage measurement unit is operated; and
the noise level subtraction unit subtracts a value, corresponding to a result of multiplying an estimated noise current by a measurement result of the alternating-current impedance previously measured for the battery cell as a measurement target, from a voltage output from the voltage measurement unit.

14. The battery monitor system according to claim 8, wherein:
the control unit causes the noise measurement unit to measure the noise while sweeping a frequency as a measurement target; and
a higher level system generates a data table showing a noise value at each frequency.

* * * * *